United States Patent [19]
Glover et al.

[11] Patent Number: 5,268,908
[45] Date of Patent: Dec. 7, 1993

[54] LOW DATA DELAY TRIPLE COVERAGE CODE APPARATUS FOR ON-THE-FLY ERROR CORRECTION

[75] Inventors: Neal Glover, Broomfield; David R. Hieb, Boulder; Trent O. Dudley, Littleton; Dennis L. Baker, Louisville, all of Colo.

[73] Assignee: Storage Technology Corporation, Louisville, Colo.

[21] Appl. No.: 717,677

[22] Filed: Jun. 19, 1991

[51] Int. Cl.$^5$ .............................................. G06F 11/10
[52] U.S. Cl. ................................ 371/37.1; 371/38.1
[58] Field of Search ................ 371/37.1, 37.2, 37.7, 371/37.6, 38.1, 39.1, 44, 45

[56] References Cited
U.S. PATENT DOCUMENTS

| | | | |
|---|---|---|---|
| 4,494,234 | 1/1985 | Patel | 371/38 |
| 4,525,838 | 6/1985 | Patel | 371/37 |
| 4,706,250 | 11/1987 | Patel | 371/39 |

Primary Examiner—Vincent P. Canney
Attorney, Agent, or Firm—Duft, Graziano & Forest

[57] ABSTRACT

The low-data-delay triple-coverage code for on-the-fly error correction apparatus allows on-the-fly error correction with fewer redundancy bytes than needed for a non-overlaid data redundancy structure thereby producing corrected data with a low data delay. The present apparatus divides a received block of data into a plurality of fixed size sub-blocks with the last sub-block size being smaller than or equal to the fixed sub-block size. Three predefined error correcting code generator polynomials are used to accumulate redundancy values for the sub-blocks. At the end of each sub-block one of the three pre-defined error correcting code generator polynomials will have accumulated a redundancy value across the present sub-block data and the previous two sub-blocks of data and redundancy. After the accumulated redundancy has been output as write data the predefined error correcting code generator polynomial is reset. Therefore, the redundancy information contained in each sub-block covers that sub-block's data in addition to the data and redundancy in the previous two sub-blocks.

16 Claims, 12 Drawing Sheets

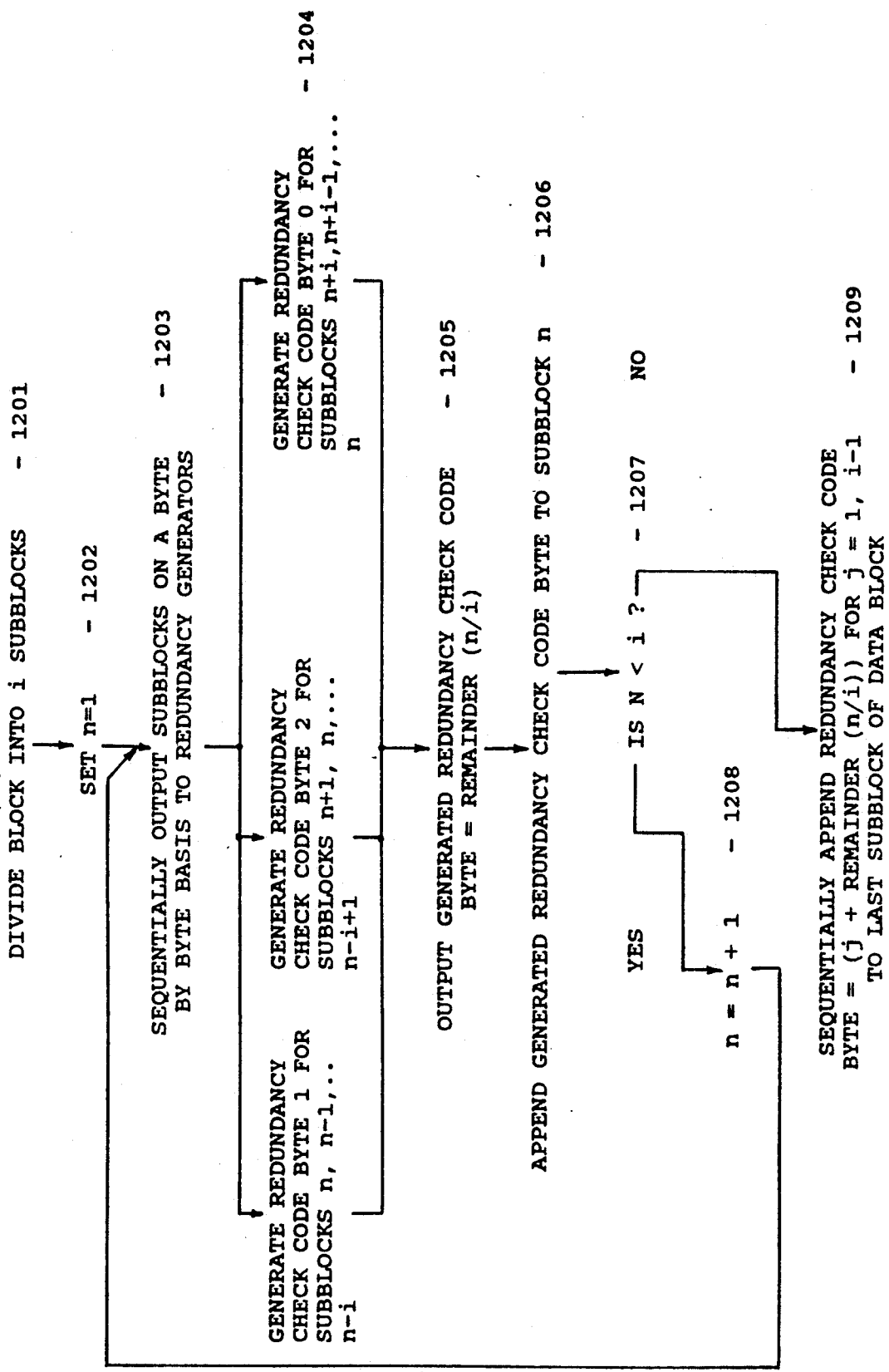

LOW DATA DELAY TRIPLE COVERAGE CODE APPARATUS FOR ON-THE-FLY ERROR CORRECTION

FIELD OF THE INVENTION

This invention relates to error correcting code systems and, in particular, to a low data delay error correcting code that permits on-the-fly error correction.

PROBLEM

It is a problem in the field of data transmission and data storage systems to provide an error correcting code that enables the system to detect and correct multiple errors in the data without significantly impacting the data transmission or storage speed. There are numerous existing error correcting code arrangements U.S. Pat. No. 4,494,234 discloses an on-the-fly multibyte error correcting system that corrects up to T errors in the sub-block of data using $2*T$ syndrome bytes. This apparatus generates $2*T$ syndrome bytes using the modulo two sum of bit positions in the code word of data, selected according to a parity check matrix, while the code word of data is shifted into a buffer memory The $2*T$ syndrome bytes are then used to identify up to T errors in the code word of data. These errors are corrected on the fly as the code word is output byte by byte from the buffer memory and the next code word of data is concurrently input to the buffer memory. While this is described as on-the-fly correction it involves at least one sub-block of delay in the data transmission while the error correction takes place.

U.S. Pat. No. 4,525,838 discloses a multi-byte error correcting system that uses a two-level code structure to correct $T_1$ errors in the sub-block using $2*T_1$ syndrome bytes and $T_2$ errors on a block basis using $2*T_2$ syndrome bytes where $T_2$ is greater than $T_1$. This apparatus divides each block of data into a plurality of equal-size sub-blocks of data. The apparatus generates $2*T_1$ syndrome bytes for each sub-block of data corresponding to the modulo T sum of bit positions in the sub-block of data selected according to a parity check matrix. These $2*T_1$ syndrome bytes are used to correct up to $T_1$ errors for each sub-block of data. When more than $T_1$ errors occur in one of the sub-blocks of data in the block of data, the $2*T_2$ block syndrome bytes can be used to supplement the sub-block syndrome bytes to correct these additional errors. This is accomplished by generating $2*T_2$ syndrome bytes corresponding to the modulo two sum of bit positions in the corrected sub-blocks of data selected according to a parity check matrix. The original block syndrome bytes are modified to reflect the miscorrection in the one sub-block containing excessive errors and these modified $2*T_2$ sub-block syndrome bytes are used to correct up to $T_2$ errors in the selected sub-block of data.

U.S. Pat. No. 4,706,250 discloses apparatus for correcting multi-byte errors using an improved two-level error code. This apparatus detects $T_1$ plus C errors and corrects $T_1$ errors in the sub-block using $2*T$: plus C syndrome bytes and $T_2$ errors on a block basis using $2*T_2$ syndrome bytes where $T_2$ is greater than $T_1$. This apparatus divides a block of data into a plurality of equal size sub-blocks of data. The apparatus generates $2*T_1$ plus C syndrome bytes for each sub-block of data corresponding to the modula two sum of bit positions in the sub-block of data selected to a parity check matrix. These $2*T_1$ plus C syndrome bytes are used to detect up to $T_1$ plus C errors and correct up to $T_1$ errors in each sub-block of data. When more than $T_1$ errors occur in one of the sub-blocks of data in the block of data, the $2*T_2$ syndrome bytes can be used to supplement the $2T_1$ plus C sub-block syndromes bytes to correct these additional errors. This is accomplished by generating $2*T_2$ block syndrome bytes corresponding to the modulo two sum of bit positions in the corrected sub-blocks of data selected according to a parity check matrix. The original block syndrome bytes are modified to reflect this correction in the one sub-block containing excessive errors and these modified two $T_2$ syndrome bytes are used to correct up to $T_2$ errors in the selected sub-block of data.

It is the object of the present invention to provide a multibyte error correcting system in which the location and error pattern of erroneous bytes in a data stream are uniquely identified as bytes are being transferred from the error correcting system and yet suffer less buffer delay than prior art error correction arrangements.

SOLUTION

The above described problems are solved and a technical advance achieved in the field by the low-data-delay triple-coverage code for on-the-fly error correction. This apparatus provides a low data delay by utilizing an overlaid data redundancy structure which allows on-the-fly error correction with fewer redundancy bytes than needed for a non-overlaid data redundancy structure, thereby producing corrected data with a low data delay. The present apparatus divides a received block of data into a plurality of fixed-size sub-blocks with the last sub-block size being smaller than or equal to the fixed sub-block size. Three predefined error correcting code generator polynomials are used to accumulate redundancy values for the sub-blocks. At the end of each sub-block, one of the three predefined error correcting code generator polynomials will have generated a redundancy value across the present sub-block's data and, with the exception of the first two sub-blocks, the previous two sub-blocks data and redundancy. Note that the first sub-block's redundancy only covers the first sub-block of data and redundancy and that the second sub-block's redundancy covers both the first and second sub-blocks data and redundancy. After the accumulated redundancy has been output as write data, the predefined error correcting code generator polynomial is reset. Therefore, every third sub-block's redundancy bytes come from one of the same three predefined error correcting code generator polynomials. The code generator polynomials used in preferred embodiment to produce the redundancy bytes are constructed from a degree 3, distance 4, non-interleaved Reed-Solomon code operating on byte-wide symbols of data. During on-the-fly correction, each sub-block redundancy need only correct that sub-block's data and redundancy since errors in the previous two sub-block's data and redundancy have been adjusted out. The Reed-Solomon Code used in the preferred embodiment can correct two adjacent eight-bit symbols in error as long as the total error burst does not exceed eight bits.

When a sub-block error exceeds the single burst correction capability of the on-the-fly correction apparatus, a non-on-the-fly error correction system is activated to correct the additional error burst not corrected by the on-the-fly error correction apparatus. The non-on-the-fly error correction system is a software implemented correction algorithm which uses the triple sub-block code structure to allow the correction of this additional error burst in one of the sub-blocks. This non-on-the-fly error correction system searches one sub-block at a time through the data record in the forward direction to locate a sub-block that is single sub-block uncorrectable. This process is then repeated from the other end of the data record in the reverse direction to locate a single sub-block uncorrectable sub-block. These two pointers are then used with an error correction algorithm to correct the one or a finite number of sub-blocks bounded by the two pointers.

BRIEF DESCRIPTION OF THE DRAWING

FIG. 12 illustrates in flow diagram form the operation of the low data delay triple coverage code apparatus.

DETAILED DESCRIPTION

The low-data-delay triple-coverage code for on-the-fly error correction provides a robust error correction code that can detect and correct multi-bit errors within a block of data while operating in an on-the-fly mode to thereby produce corrected data with a low data delay. The present apparatus divides a received block of data into a plurality of fixed-size sub-blocks, with the last sub-block size being lesser than or equal to the fixed sub-block size. With the exception of the beginning and end of the record, each sub-block redundancy covers all its own data and all of the data and redundancy of the previous two sub-blocks. Alternately, each sub-block's data are covered by its own redundancy and the redundancy of the next two sub-blocks. Note that the last three sets of redundancy cover three, two and one sub-blocks of data respectively whereas the first three sets of redundancy cover one, two and three sub-blocks of data respectively. The code generator polynomials used to produce the redundancy bytes are constructed from a degree 3, distance 4, non-interleaved Reed-Solomon code operating on byte wide symbols of data.

System Architecture

Figure 1:
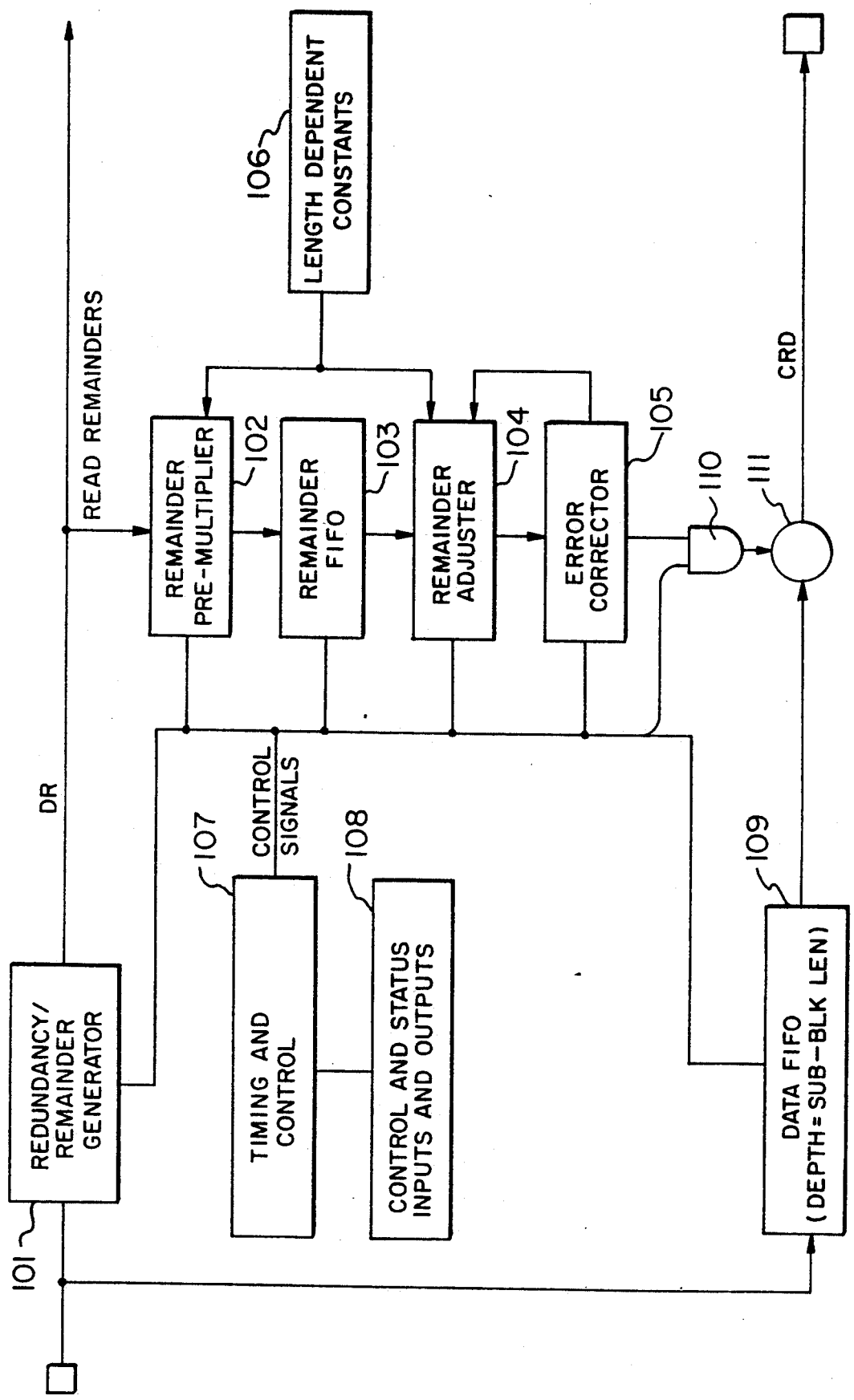
FIG. 1 illustrates the low data delay triple coverage code apparatus for on-the-fly error correction in block diagram form.

FIG. 1 illustrates the overall architecture and FIG. 12 illustrates a flow diagram of the present triple coverage code apparatus 100. During a write operation the received block of input data is divided into i sub-blocks at step 1201. At step 1202, the variable n is set equal to 1 and the sub-blocks are sequentially output to the redundancy generators at step 1203. Each sub-block is fed on a byte-by-byte basis into the redundancy/remainder generator 101 which computes the redundancy bytes to be appended to each sub-block. Also, the input data is simultaneously output on the lead WDR. At the end of the sub-block the input data is stopped while the redundancy bytes, generated by redundancy/reminder generator 101 are output on lead WDR. Due to the nature of the triple-coverage code contained in the triple-code coverage apparatus 100, the redundancy/remainder generator 101 is actually a plurality (three in this embodiment) of separate generators (201-203) all working in parallel. During each sub-block redundancy time, the appropriate one of these three separate generators 201-203 is activated by timing and control circuit 107 via bus CONTROL-SIGNALS and the activated generator places its redundancy bytes on the WDR bus so that all data and redundancy bytes are written to the media in the proper sequence. Once the redundancy bytes are output by the associated generator, the generator is reset and begins computing redundancy for the next logical sub-block triplet.

Figure 10:
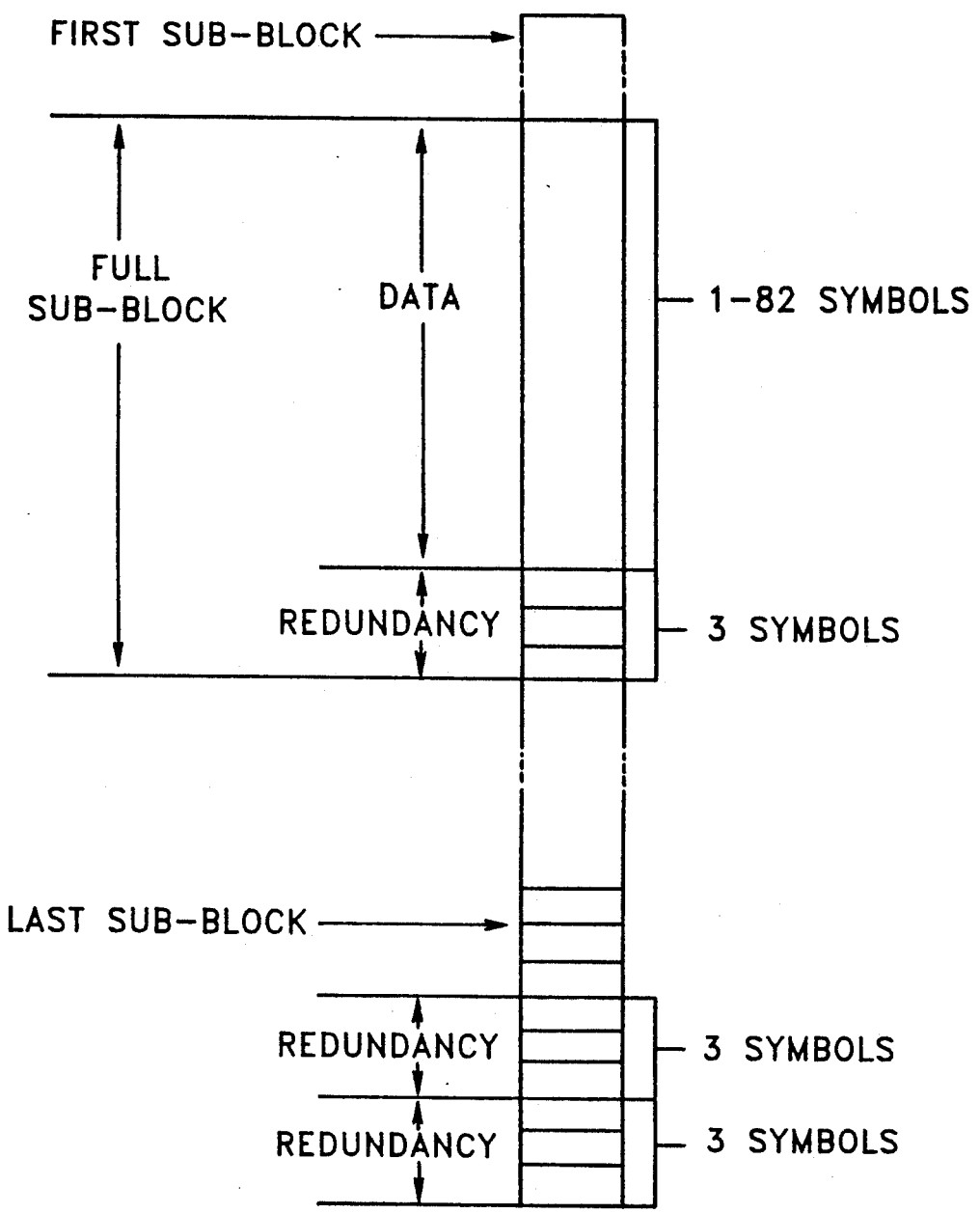
FIG. 10 illustrates the data and redundancy code relationship in a single sub-block.
Figure 11:
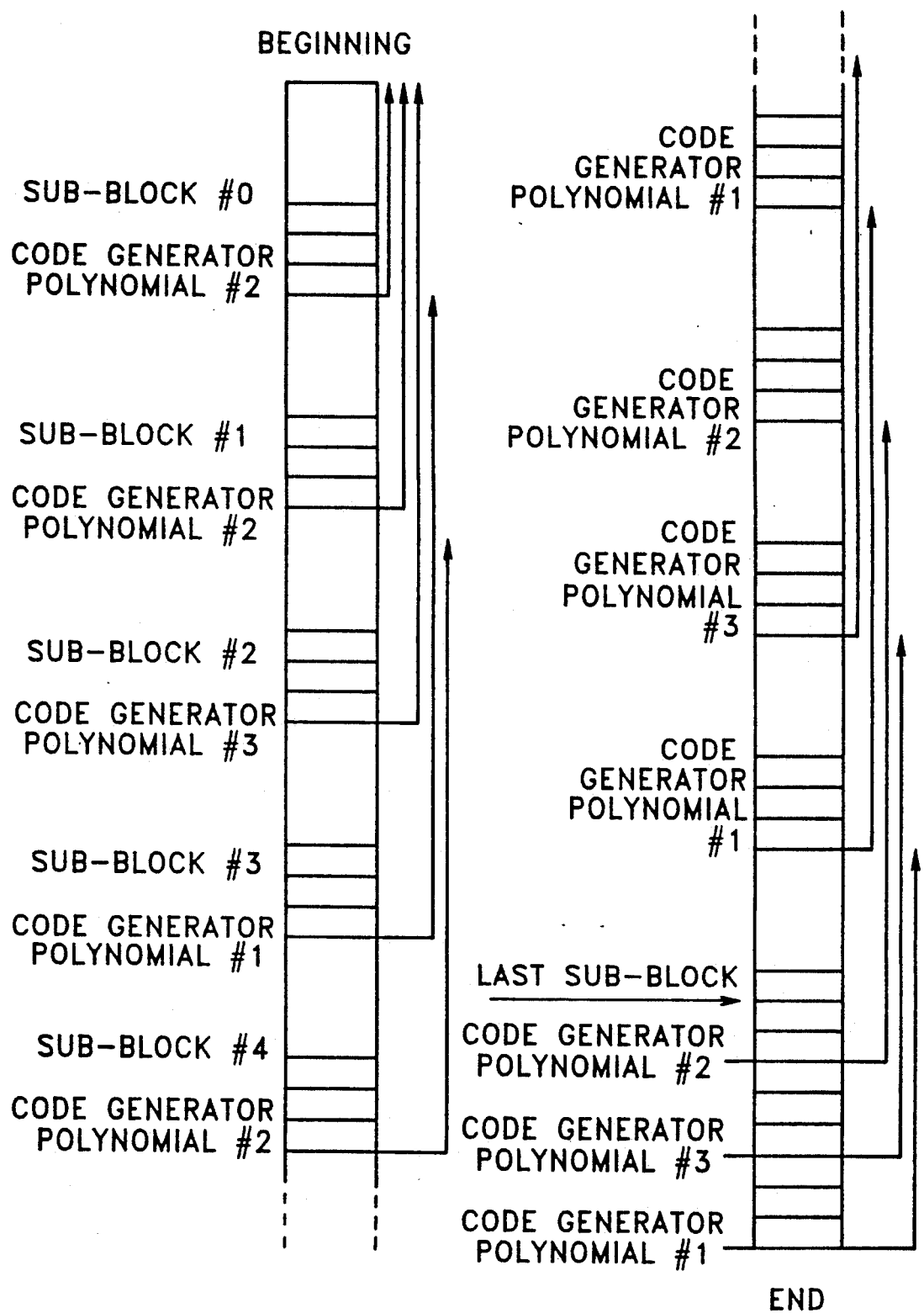
FIG. 11 illustrates the data and redundancy code relationship for an entire record.

The flow diagram of FIG. 12 illustrates the operation of the redundancy generators 201-203 while FIGS. 10 and 11 illustrate the layout of the data and redundancy in a block of data. In particular, FIG. 10 demonstrates a block of data divided into i sub-blocks, with each sub-block having appended thereto a set of redundancy code bytes comprising three symbols. The final or i'th sub-block includes its associated set of redundancy check code bytes in addition to two sets of redundancy check code bytes of three symbols each.

The relationship of the redundancy check code bytes to the sub-blocks is illustrated in FIG. 11. In this code overlap arrangement, code generator A (201) with code generator polynomial 1 produce a set of redundancy check code bytes for the first sub-block of data. The second code generator B (202) with code generator polynomial 2 produce a set of redundancy check code bytes for the first and second sub-blocks of data and the set of redundancy check code bytes associated with the first sub-block. The third code generator C (203) with code generator polynomial 3 produces a set of redundancy check code bytes for the first, second and third sub-blocks of data and the sets of redundancy check code bytes associated with the first and second sub-blocks. This check code overlap continues for all the remaining sub-blocks until the last or ith sub-block is reached. In the example of FIG. 11, the last sub-block and the two preceding sub-blocks are covered by code generator polynomial 2. Once the set of redundancy check code bytes produced by this polynomial are appended to the last sub-block, the code generator polynomial 3 of code generator C (203) produces a set of redundancy check code bytes for the data of the i'th and (i−1)st sub-blocks and the redundancy check code bytes associated with these. Finally, the code generator polynomial 1 of code generator A (201) produces a set of redundancy check code bytes for the ith sub-block and the two appended sets of redundancy check code bytes.

This process is illustrated in steps 1204–1209 of FIG. 12. Steps 1204-1 to 1204-i illustrate the operation of the k parallel connected redundancy generators (201-203). Each redundancy generator computes redundancy check code bytes covering a sub-block and (k-1) immediately preceding sub-blocks. The operation of the k redundancy generators are interleaved such that for each received sub-block, one generated set of redundancy check code bytes are produced to be appended to the sub-block. The selection process 1205 embodied by multiplexor 204, and timing and control circuit 107 selects the appropriate redundancy generator (201–203). This selection process is described in FIG. 12 as calculating the remainder obtained as a result of the division of variable n by the variable k. This sequentially selects the redundancy generators to output the generated redundancy check code bytes.

At step 1206 the selected bytes are appended to the presently received sub-block. At step 1207, a determination is made whether the variable n is less than k to identify the presence of the last sub-block. If the present sub-block is not the last sub-block, at step 1208 the variable n is incremented and control returns to step 1203. When the last sub-block is received, processing advances to step 1209 where the next successive (k-1) redundancy generators are activated to output their respective redundancy check code bytes to be appended to the last sub-block.

Data Read

During a read operation, the input data bytes are concurrently fed into data FIFO 109 and the redundancy/remainder generator 101. During each sub-block redundancy time, the appropriate generator places its remainder on the WDR bus after which the generator is re-initialized. The remainders so produced are sent to the remainder pre-multiplier 102 to be multiplied by the appropriate values in order for each remainder to be positioned at the first state of its remainder sequence. A unique remainder sequence is known to exist for each of the three unique code generator polynomials realized in the three redundancy remainder generators 201–203. After a remainder has been generated, it needs to be clocked around its remainder sequence and positioned in its first state in order to be remainder decoded in the error corrector 105. The pre-multiplied remainders are sent by remainder pre-multiplier 102 to the remainder FIFO 103. In general, a remainder FIFO delay is not necessary and is primarily used in the event of a last sub-block which is shorter than the other sub-blocks. If this situation exists, the remainder for the short sub-block is computed before the end of one full sub-block time. Also, the two extra sets of remainders immediately following the last sub-block require a delay. The remainder FIFO 103 is therefore used to accumulate remainders in an asynchronous manner for the last sub-block of data.

The remainders stored in the remainder FIFO 103 are transmitted to the remainder adjuster 104 to adjust out any correctable errors that have been identified by the error corrector 105. The error corrector 105 uses the remainder computed on the first sub-block to identify a correctable error burst in that sub-block. If the error corrector 105 identifies a correctable error burst in the sub-block stored in data FIFO 109, that error burst's contribution to the second and third remainders needs to be adjusted out so that the second and third remainders can be used by the error corrector 105 to identify and correct errors in their respective sub-blocks. The timing of the triple code coverage apparatus 100 is such that the error corrector 105 is one sub-block time behind the actual data in its identification of the errors and their locations. Therefore, the read data is stored in the data FIFO 109 for one sub-block time so that the actual errors in the data and the error symbols identified by the error corrector 105 precisely cancel each other upon being EXCLUSIVE-ORed by the EXCLUSIVE-OR gate 111 at the output leads CRD.

Finite Field Definition

In order to better understand the operation of the triple-code coverage apparatus 100, the code generation mathematics are described herein. If $\beta^i$ represents elements of the finite field generated by the following primitive polynomial over $GF(2^8)$, $$P(x) = X^8 + x^4 + x^3 + x^2 + 1 \tag{1}$$

then elements of the finite field employed by the selected code are given by:

$$\alpha^i = (\beta^i)^{23} \tag{2}$$

Code Generator Polynomials $$G1(x) = \prod_{i=169}^{171} (x - \alpha^i) \tag{3}$$
$$= (x - \alpha^{169})(x - \alpha^{170})(x - \alpha^{171})$$
$$= x^3 + \alpha^{22}x^2 + \alpha^{192}x + \alpha^0$$

$$G2(x) = \prod_{i=172}^{174} (x - \alpha^i) \tag{4}$$
$$= (x - \alpha^{172})(x - \alpha^{173})(x - \alpha^{174})$$
$$= x^3 + \alpha^{25}x^2 + \alpha^{198}x + \alpha^9$$

$$G3(x) = \prod_{i=175}^{177} (x - \alpha^i) \tag{5}$$
$$= (x - \alpha^{175})(x - \alpha^{176})(x - \alpha^{177})$$
$$= x^3 + \alpha^{28}x^2 + \alpha^{204}x + \alpha^{18}$$

Constant Multipliers

The three code generator polynomials (equations 3–5) that are implemented in the redundancy/remainder generator 101 are defined in tables 1–3 as binary arrays. Each binary array defines one of the finite field constant multipliers (CM1, CM2, ..., CM9). The power of $\alpha$ of each multiplier constant is listed above its array. Each column of an array defines a parity tree for one output bit of the constant multiplier with the least significant bit (LSB) appearing on the right of the array. The inputs to the rows are the bits of the variable finite field element to be multiplied by the constant with the least significant bit (LSB) appearing at the top of the array. A "1" at the intersection of a row and column indicates that the column parity tree has an input from the row.

TABLE 1
Multipliers for Degree 3 Code Generator Polynomial #1

| 22 | 192 | 0 |
|---|---|---|
| 11011000 | 11100111 | 00000001 |
| 10101101 | 11010011 | 00000010 |
| 01000111 | 10111011 | 00000100 |
| 10001110 | 01101011 | 00001000 |
| 00000001 | 11010110 | 00010000 |
| 00000010 | 10110001 | 00100000 |
| 00000100 | 01111111 | 01000000 |
| 00001000 | 11111110 | 10000000 |

```
 ...        ...         ...
  |          |           └─ Parity Tree 0
  |          └─ Parity Tree 7
  |         Parity Tree 8
  └─ Parity Tree 15
 Parity Tree 16
Parity Tree 23
```

TABLE 2
Multipliers for Degree 3 Code Generator Polynomial #2

| 25 | 198 | 9 |
|---|---|---|
| 10111110 | 01010110 | 10100110 |
| 01100001 | 10101100 | 01010001 |
| 11000010 | 01000101 | 10100010 |
| 10011001 | 10001010 | 01011001 |
| 00101111 | 00001001 | 10110010 |
| 01011110 | 00010010 | 01111001 |
| 10111100 | 00100100 | 11110010 |
| 01100101 | 01001000 | 11111001 |

```
 ...        ...         ...
  |          |           └─ Parity Tree 24
  |          └─ Parity Tree 31
  |         Parity Tree 32
  └─ Parity Tree 39
 Parity Tree 40
Parity Tree 47
```

TABLE 3
Multipliers for Degree 3 Code Generator Polynomial #3

| 28 | 204 | 18 |
|---|---|---|
| 11011010 | 01000100 | 01110011 |
| 10101001 | 10001000 | 11100110 |
| 01001111 | 00001101 | 11010001 |
| 10011110 | 00011010 | 10111111 |
| 00100001 | 00110100 | 01100011 |
| 01000010 | 01101000 | 11000110 |
| 10000100 | 11010000 | 10010001 |
| 00010101 | 10111101 | 00111111 |

```
 ...        ...         ...
  |          |           └─ Parity Tree 48
  |          └─ Parity Tree 55
  |         Parity Tree 56
  └─ Parity Tree 63
 Parity Tree 64
Parity Tree 71
```

Hardware Self Checking

To provide checking of the apparatus and insure the integrity of the error correction code hardware itself, one might employ a method of self checking called "pass through parity". When this technique is employed, parity prediction is used to establish the parity at the output of all function blocks. At particular points in the circuit, predicted parity is compared to actual parity and an alarm is raised if they differ. In such a manner, "pass through parity" might be employed as the received data is carried through all stages of the redundancy, remainder generation and processing. Special consideration must be given to the parity checking of the previously discussed constant multipliers. Table 4 outlines the unique parity functions P(x) for each of the constant multipliers CM1 through CM9.

TABLE 4

| CM# | Multiplier | Parity Function p(x) |
|---|---|---|
| CM3 | 0 | $P(P_{in})$ |
| CM6 | 9 | $P(P_{in}, x^0, x^3, x^4, x^7)$ |
| CM9 | 18 | $P(P_{in}, x^2, x^4, x^5, x^7)$ |
| CM1 | 22 | $P(P_{in}, x^0, x^2, x^3)$ |
| CM4 | 25 | $P(P_{in}, x^0, x^3, x^7)$ |
| CM7 | 28 | $P(P_{in}, x^1, x^4, x^5, x^6)$ |
| CM2 | 192 | $P(P_{in}, x^0, x^2, x^5)$ |
| CM5 | 198 | $P(P_{in}, x^0, x^1, x^4, x^5, x^6, x^7)$ |
| CM8 | 204 | $P(P_{in}, x^0, x^1, x^7)$ |

Redundancy/Remainder Generator

Figure 2:
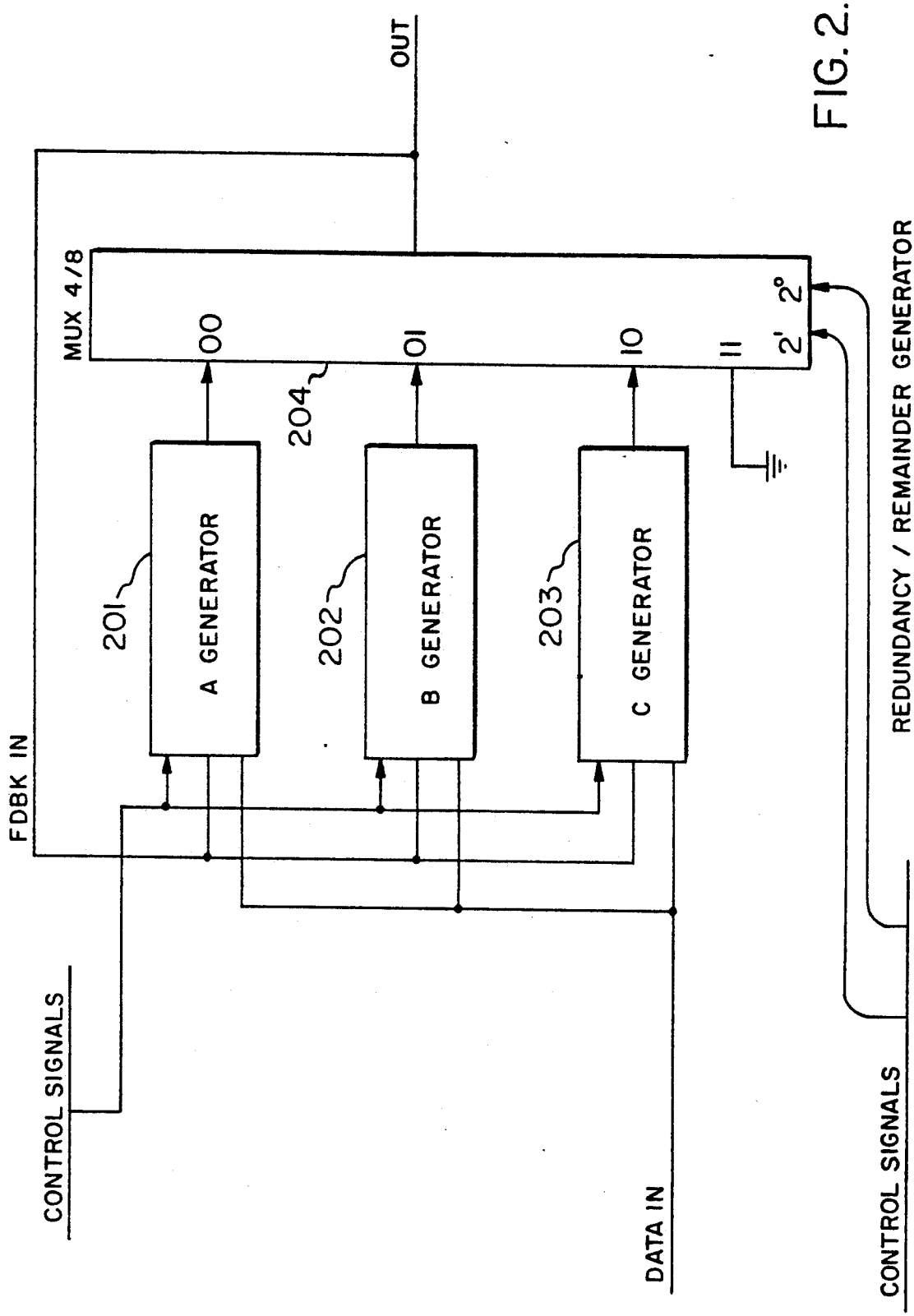
FIG. 2 illustrates additional details of the redundancy/remainder generator.

FIG. 2 illustrates in further detail the circuitry contained within redundancy/remainder generator 101. The three code generators 201-203 that are illustrated in block diagram form in FIG. 2 are connected in parallel such that input data appearing on bus DATA IN is concurrently applied to the input of all three code generators 201-203. During the end of each sub-block, control signals generated by timing and control circuit 107 and applied via bus CONTROL-SIGNALS reset one of the three code generators 201-203 to a specific initialization pattern. The redundancy or remainder bytes so produced are output to multiplexer 204 which is enabled again by the appropriate control signals produced by timing and control circuit 107 and applied via bus CONTROL-SIGNALS, to interconnect the output of a selected code generator 201-203 to the output bus WDR. During non-redundancy/remainder times the input data appearing on the bus DATA IN is passed through multiplexer 204 and output onto bus WDR.

Figure 6:
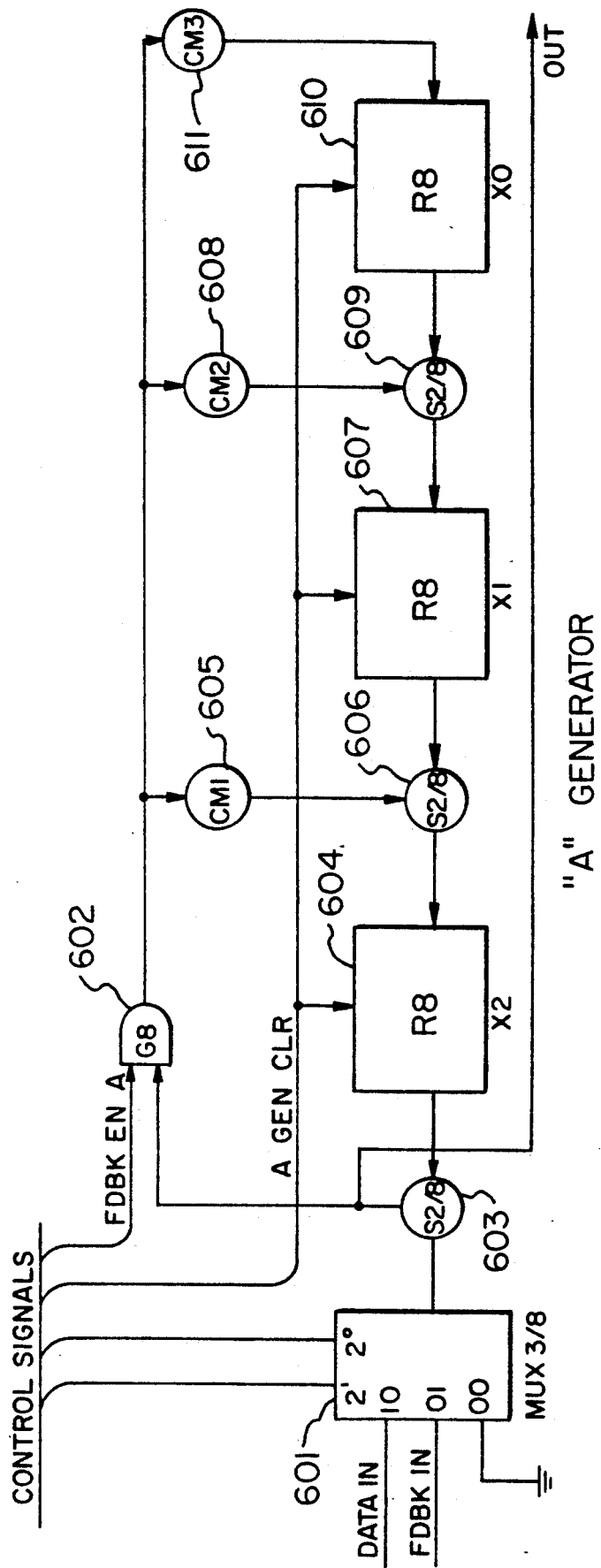
FIG. 6 illustrates additional details of the redundancy generator.

FIG. 6 illustrates in further detail the elements contained within a typical code generator, such as code generator 201. In code generator 201, multiplexer 601 applies either the input data on bus DATA-IN, the feedback signals on lead FDBK-IN or a string of zeros represented by circuit ground as designated by control signals on bus CONTROL-SIGNALS to EXCLUSIVE-OR gate 603. ESCLUSIVE-OR gate 603, 606, and 609 in conjunction with the byte wide registers 604, 607, and 610 and the constant multipliers 605, 608, and 611 operate in a manner to implement the code generator polynomial listed above in equation 3. The constant multipliers 605, 608, and 611 represent the constant multiplier $\alpha^{22}$, $\alpha^{192}$ and $\alpha^0$ for the polynomial of equation 3. For the code generator polynomial listed in equation 4 above, the constant multipliers 605, 608 and 611 would be implemented using constant multipliers $\alpha^{25}$, $\alpha^{198}$ and $\alpha^9$ respectively. Similarly, for the code generator polynomial represented by equation 5 above, constant multiplier 605, 608 and 611 would be implemented with multipliers $\alpha^{28}$, $\alpha^{204}$ and $\alpha^{18}$ respectively. Thus, the circuitry of FIG. 6 operates on the input data that is received on a bytewise basis to produce the redundancy bytes in the case of data to be written to the data storage media or remainder information in the case of data read from the data storage media using one of the three code generator polynomials selected by timing and control circuit 107 for a particular sub-block of input data. In the case of data to be written to the data storage media, the redundancy bytes produced by redundancy/remainder generator 101 are output on lead WDR and the generator is reinitialized for the next sub-block of data received on bus DATA IN. In the case of data read from the data storage media, the remainder bytes produced by redundancy/remainder generator 101 and output on lead WDR are applied to remainder pre-multiplier 102.

Remainder Pre-Multiplier

Figure 3:
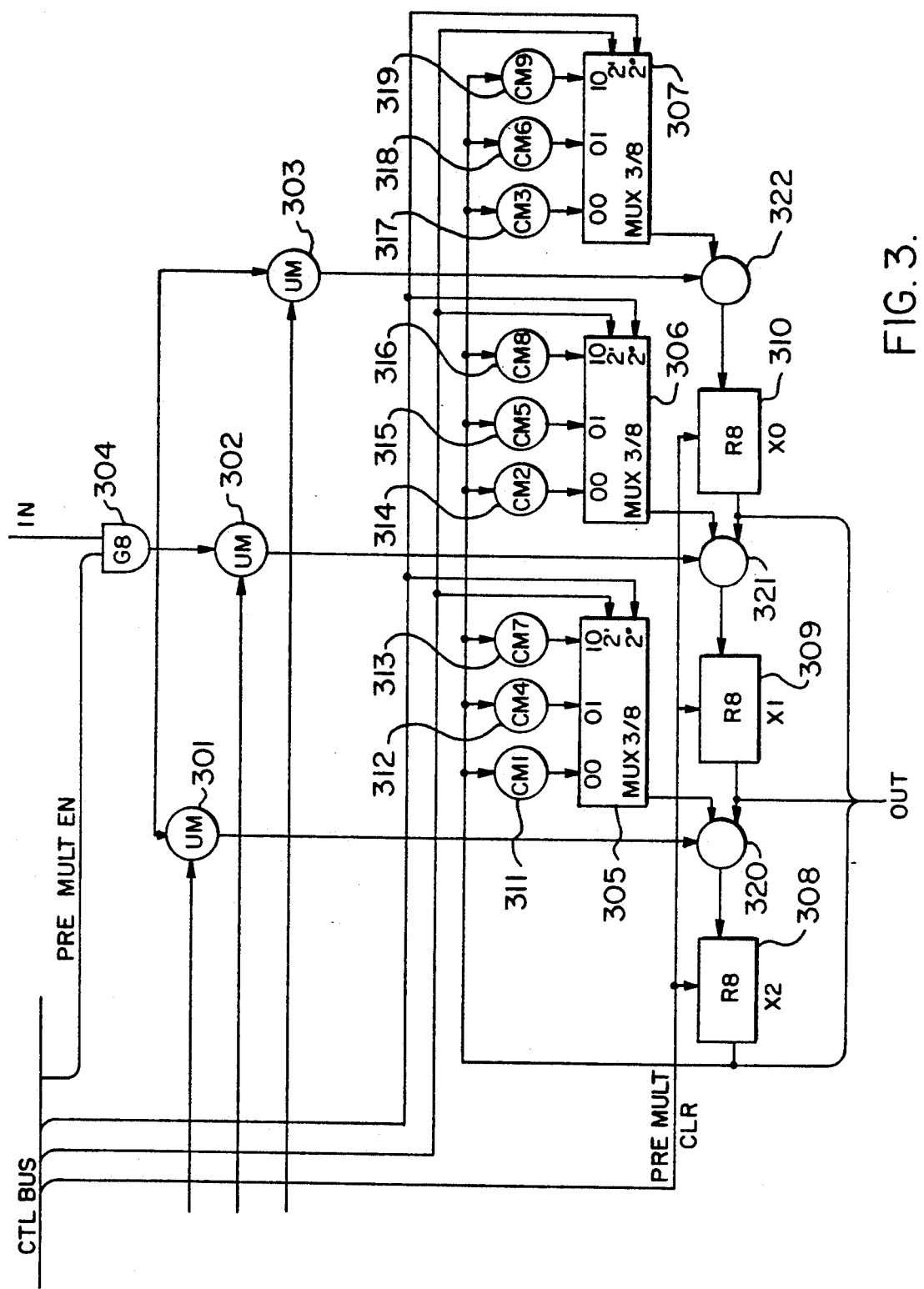
FIG. 3 illustrates additional details of the remainder pre-multiplier.
Figure 8:
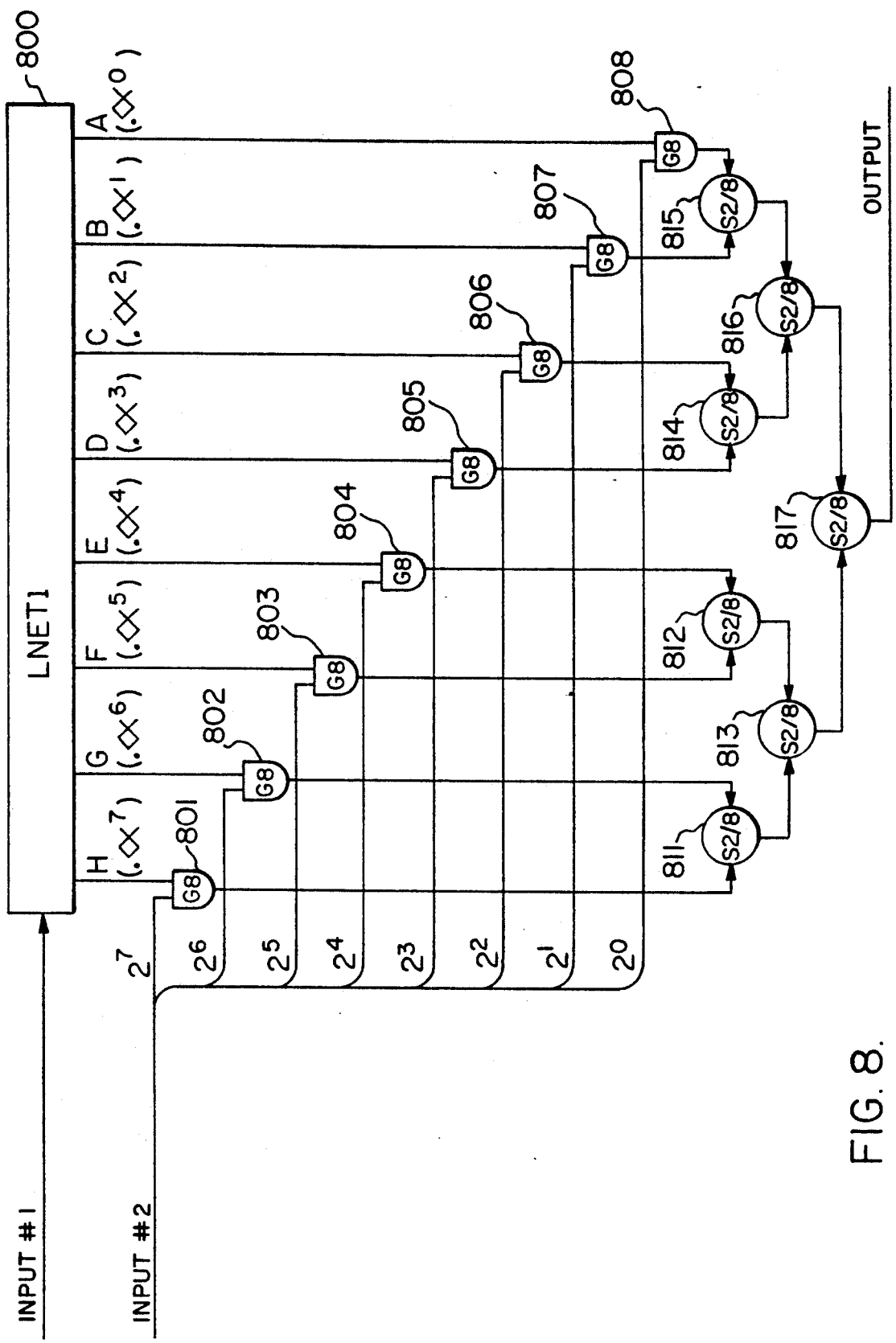
FIG. 8 illustrates additional details of the variable multiplier.
Figure 9:
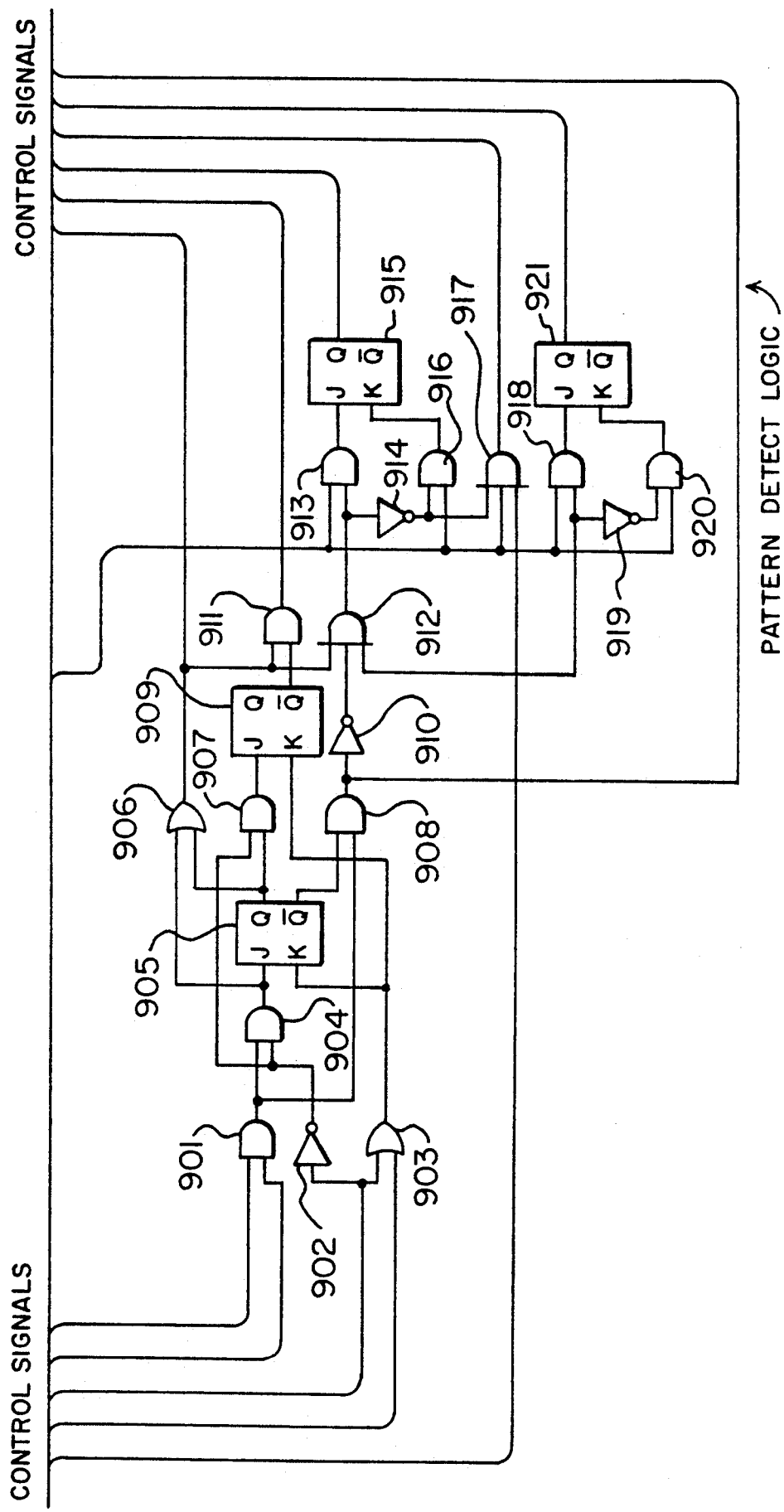
FIG. 9 illustrates the pattern detect logic.

FIG. 3 illustrates additional details of the circuitry contained within remainder pre-multiplier 102. In particular, the remainders generated by redundancy/remainder generator 101 are input on lead WDR through enable gate 304 and simultaneously applied to variable multipliers 301-303. Constants generated by a length dependent constant circuit 106 are simultaneously applied to variable multipliers 301-303. FIG. 8 illustrates additional details of a typical variable multiplier. In particular, a minimization of constant multiplier part 800 is used to generate eight bytes of data, each of which represents the constants generated by the length dependent constant circuit multiplied by constant multipliers $\alpha^0$ through $\alpha^7$. The second set of inputs applied to the other terminal of gates 801-808 respectively to be ANDed with the outputs of minimization of constant multiplier part 800 and thence applied to EXCLUSIVE-OR gates 811-817 to thereby produce a single byte of output which is applied to one of EXCLUSIVE-OR gates 320-322. Constant multipliers 311-319 realize the constant multipliers CM1-CM9 (e.g. $\alpha^{22}$, $\alpha^{192}$, $\alpha^0$, ...) whose outputs are applied via multiplexers 305-307 to corresponding EXCLUSIVE-OR gates 320-322 and thence to byte wide registers 308-310. In this manner, timing and control circuit 107 activates via bus CONTROL SIGNALS a selected constant multiplier for each of the multiplexers 305-307 to correspond to the selected code generator polynomials implemented within redundancy/remainder generator 101. The registers 308-310 produce the most significant byte, median significant byte and least significant byte respectively to provide a three byte wide output signal which is applied to the remainder FIFO 103 and thence to remainder adjuster circuit 104.

Remainder Adjuster Circuit

Figure 4:
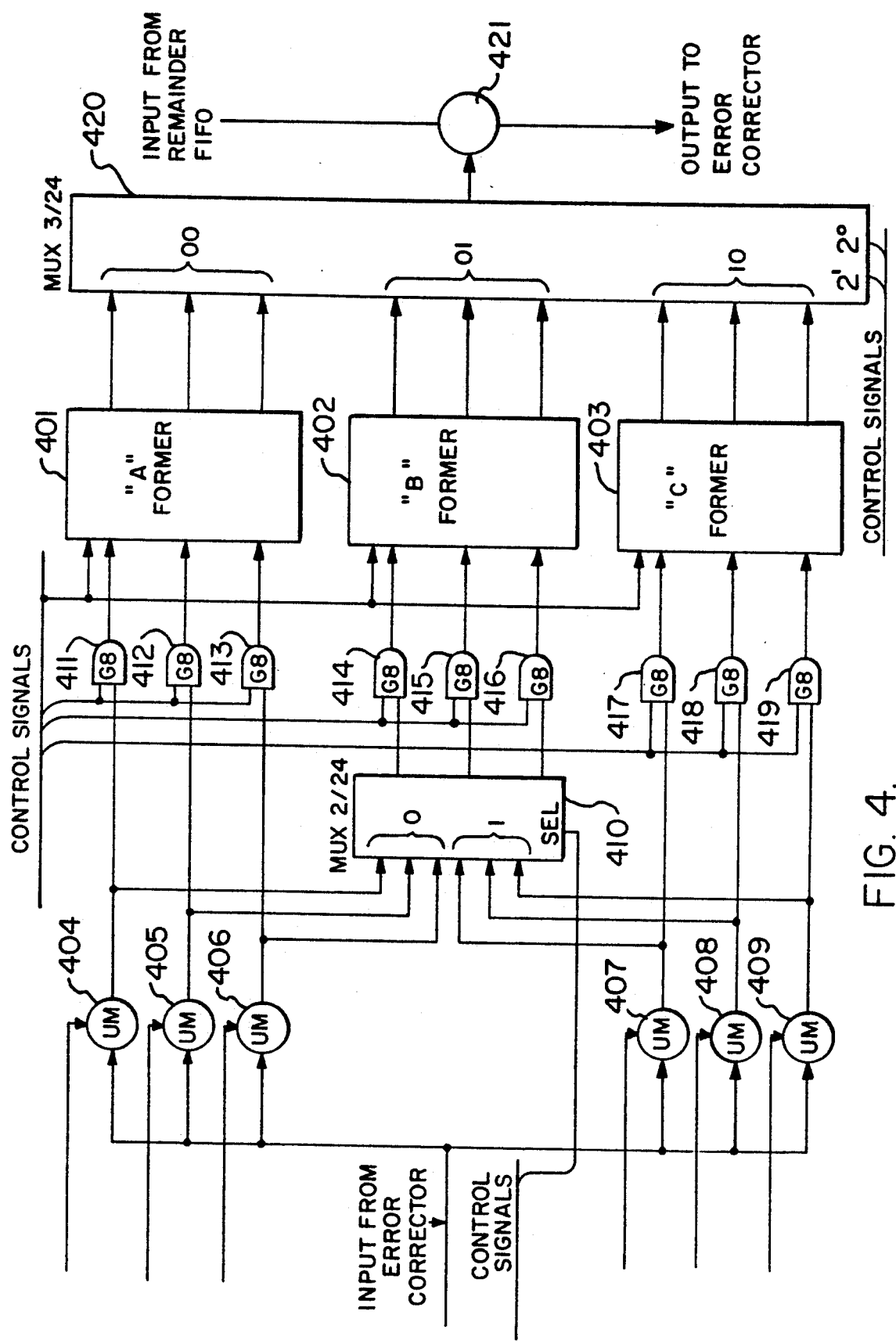
FIG. 4 illustrates additional details of the remainder adjuster.
Figure 7:
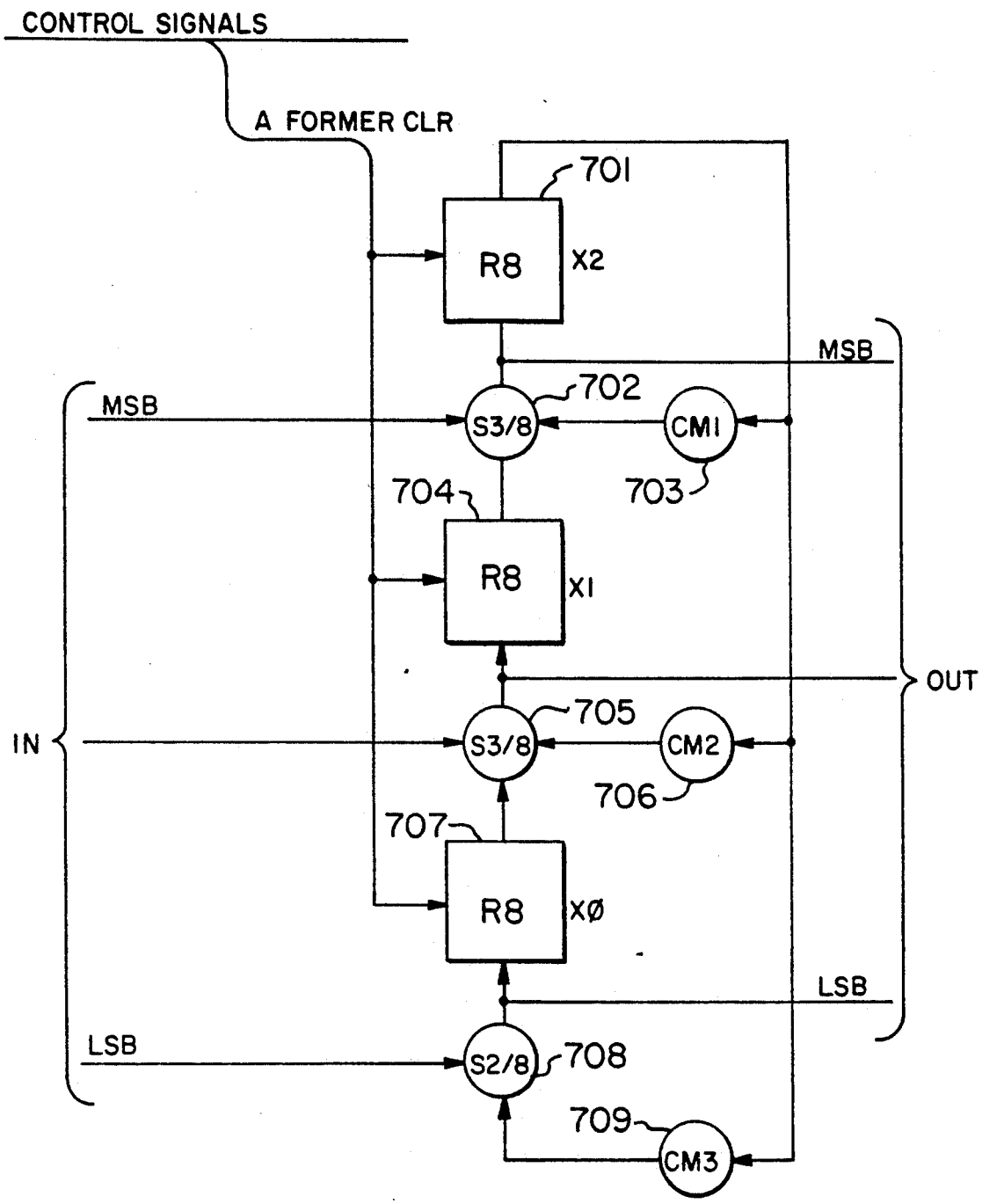
FIG. 7 illustrates additional details of the former circuit.

FIG. 4 illustrates the remainder adjuster circuit in additional detail. The three byte wide output signal from remainder FIFO 103 is applied to EXCLUSIVE-OR gate 421 and thence output to error corrector circuit 105. Remainder adjuster 104 functions to adjust data input from both error corrector circuit 105 and constant generated by length dependent constant circuit 106 via variable multipliers 404-409. The outputs of variable multipliers 404-409 are applied via multiplexer 410 to gates 411-419 then leading to three former circuits 401-403. FIG. 7 illustrates the former circuits 401-403 in further detail. The former circuits produce a polynomial adjustment vector, which when EXCLUSIVE-ORed with the polynomial sub-block remainder transmitted from remainder pre-multiplier 102 through a remainder FIFO 103, removes the influence of correctible errors in previous sub-blocks such that each sub-block remainder temporarily only reflects the error situation for the current sub-block. The former circuits consist of three byte wide registers 701, 704, and 707, EXCLUSIVE-OR gates 702, 705, and 708 and constant multiplier 703, 706, and 709. As with the code generator circuits 201-203, the constant multipliers implemented within constant multiplier 703, 706, and 709 are a function of whether the former corresponds to the code generator polynomials in above equations 3, 4, and 5. The outputs of the A, B, and C former circuits 401-403 are applied through multiplexer 420 to the EXCLUSIVE-OR gate 421 where they are combined with the output of the remainder FIFO 103. The output of remainder adjuster circuit 104 is applied to error corrector circuit 105.

Error Corrector Circuit

Figure 5:
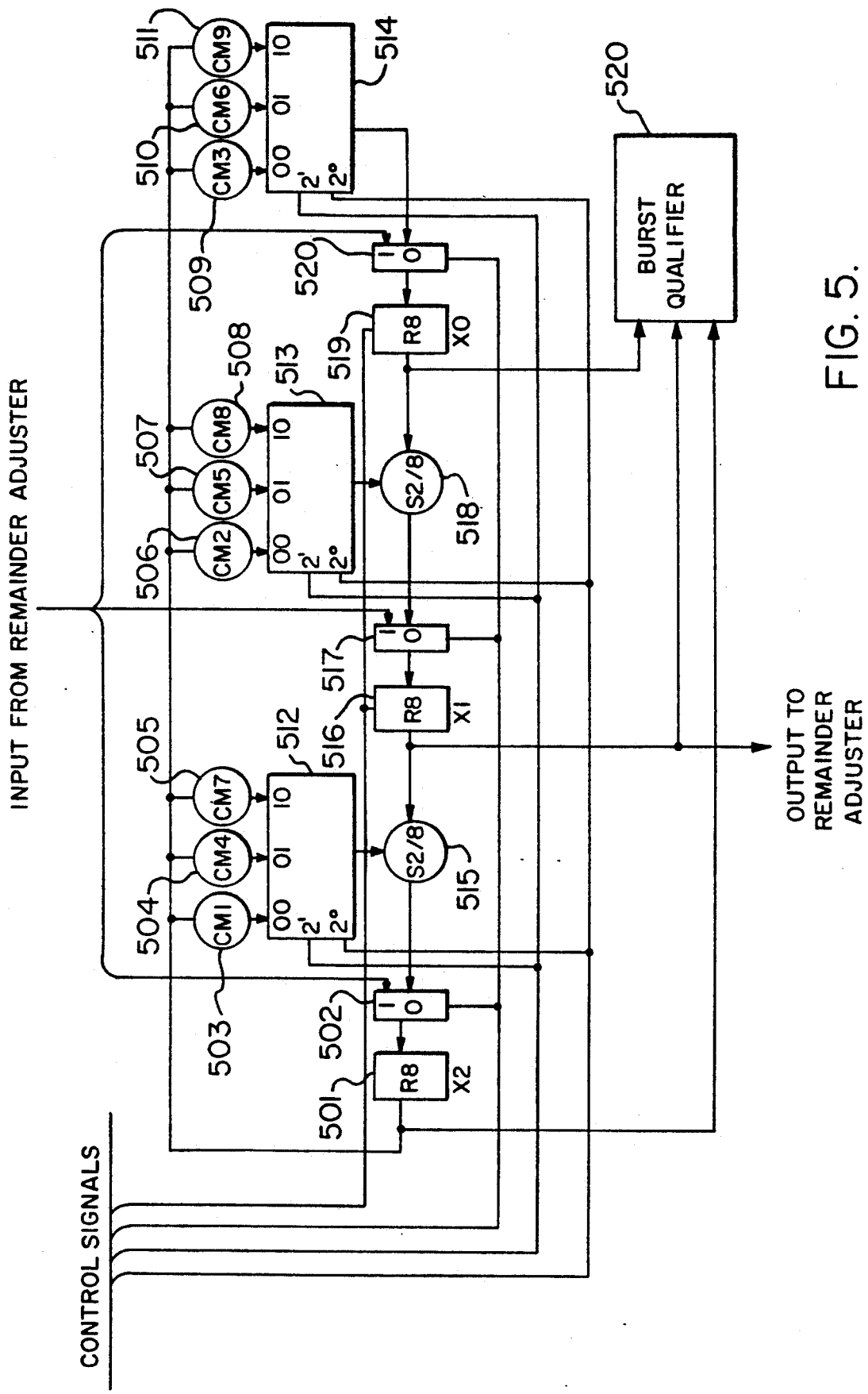
FIG. 5 illustrates additional details of the error corrector.

FIG. 5 illustrates additional details of the error corrector circuit. The three bytes output by the remainder adjuster circuit 104 are applied via multiplexers 502, 517, and 520 to byte wide registers 501, 516, and 519. As with the remainder pre-multiplier circuit 102, constant multipliers 503-511 implementing constant multipliers CM1-CM9 are switched via corresponding multiplexers 512-514 to EXCLUSIVE-OR gates 515 and 518 to produce three bytes of output signal, the values of which are applied to remainder adjuster circuit 104 and the burst qualifier circuit 520. If the burst qualifier circuit does indeed find a burst of length ($\leq 8$ bits), then via the control of the CORR-EN line and the enable gate 110, the burst qualifier circuit applies the one or two bytes that comprise the qualified burst to the EXCLUSIVE-OR gate 111. It is at this point that the error burst in the DATA FIFO 109 and the error burst coming out of the error corrector are EXCLUSIVE-ORed together and hence remove the burst from the data stream being output on bus CRD.

Non-On-The-Fly Error Correction Algorithm

If the triple code coverage apparatus 100 detects that one or more sub-blocks contain an error burst that is uncorrectable by the on-the-fly hardware correction apparatus, then a software implemented non-on-the-fly correction algorithm is utilized. The software-implemented correction algorithm begins operation with the first sub-block of data and continues forward looking for a sub-block that is single sub-block uncorrectable until it either finds a candidate or reaches the end of the record. The software implemented correction algorithm then repeats the entire process starting with the last sub-block and proceeding backward until it either finds a candidate or reaches the beginning of the record. The software implemented correction algorithm thereby produces forward and reverse candidate pointers that either point to the same sub-block or enclose a finite number of sub-blocks. If indeed there is only one sub-block-uncorrectable sub-block in the entire record, then that sub-block is guaranteed to be contained in the finite range of sub-blocks enclosed by the forward and reverse candidate pointers described above. The software-implemented correction algorithm proceeds to try the nine syndrome correction algorithm on each candidate in the range of identified sub-blocks until it locates the correct sub-block or determines complete uncorrectability of the block of data.

Error Pointer Generation

The software-implemented correction algorithm begins with a complete set of raw remainders as generated by the hardware illustrated in the figures. The correction algorithm immediately converts these raw remainders to a plurality of syndromes for its own internal use. The reason for the usage of both forward and reverse passes over the data is that each time the single-burst correction algorithm uses a single set of syndromes, that set of syndromes must contain only one sub-block's error contribution. Therefore, starting with the first sub-block and progressing forward, the single burst correction algorithm uses the present sub-block syndromes to determine whether or not that sub-block has a single correctable burst. If the single-burst correction algorithm determines that a single correctable burst exists, then the error information is recorded and adjusted out of all three sets of affected syndromes.

The single-burst correction algorithm is used on each successive sub-block until an uncorrectable sub-block is detected or the last sub-block has been tested. If the single-burst correction algorithm determines an uncorrectable burst situation, then the uncorrectable sub-block number is recorded and the uncorrectable sub-block counter set to one. On a forward pass, the last possible set of syndromes to be utilized by the single burst correction algorithm is from the last full sub-block and not from either of the two extra sets of syndromes appended to the potentially short final sub-block. If the forward pass does not detect any uncorrectable sub-blocks, the last sub-block is recorded as being a forward uncorrectable sub-block. This guarantees that the forward pass produces an uncorrectable sub-block pointer whether correct or not.

The reverse pass is conceptually identical. On the first step of the reverse pass, the single-burst correction algorithm uses the second set of extra syndromes to identify correctable errors in the range from the beginning of the last full sub-block to the last symbol of the second extra set of syndromes. This extended correction range for the single burst correction algorithm is necessary to remove any error that might exist in the second to the last or third to last set of syndromes since these syndromes need to be untainted for the second and third steps of the reverse pass. By referring to FIG. 11, it is seen that the second set of extra syndromes has encoded only one sub-block worth of data, along with the two extra sets of syndromes. This shortened scope of the set of syndrome is the key to getting correctly started in the reverse pass. In the second step of the reverse pass, the single-burst correction algorithm uses the first set of extra syndromes to locate a correctable error in the second to last sub-block. This is indeed possible since the first step in the reverse pass has just identified and neutralized the effects of any correctable error burst in the last full sub-block and the last three sets of syndromes. In the third step of the reverse pass, the single burst correction algorithm uses the last sub-block's syndromes to locate a correctable error in the third to last sub-block and so on such that each sub-block is tested with the third set of syndromes that were utilized to encode that sub-block. Hence, the first sub-block is tested with the third sub-block's set of syndromes and the first two sets of syndromes are not utilized on the reverse pass.

If the reverse pass does not locate any uncorrectable sub-blocks, the first sub-block is recorded as being the reverse uncorrectable sub-block to guarantee that the reverse pass produces an uncorrectable pointer, whether correct or not. Similar to the forward pass, each time a correctable error is located in a sub-block, that error's presence is adjusted out of all the affected syndromes. Once the forward and reverse passes are complete, the correction algorithm tries the nine syndrome correction algorithm on the uncorrectable sub-block(s) in a nonbiased manner. Nonbiased is used in this application in the sense that if more than one sub-block-uncorrectable sub-block candidate exists, each one deserves the same chance at success via the nine syndrome correction algorithms. This is accomplished by using raw syndromes for each candidate and then adjusting out only the correctable errors that would incorrectly influence the syndromes used by the nine syndrome correction algorithm. In the simplest case, the forward and reverse uncorrectable pointers point to the same sub-block. With a copy of the raw syndromes, the software-implemented correction algorithm adjusts out all the correctable errors from the first sub-block through the sub-block just before the uncorrectable candidate and all the correctable errors from the last sub-block through the sub-block after the candidate. This leaves three sets of valid syndromes that contain only error information relating to the one uncorrectable sub-block. At this point, the software-implemented correction algorithm generates nine consecutive syndromes out of the three sets of valid sub-block syndromes and sends these syndromes into the nine syndrome correction algorithm. If the sub-block in error contains one burst of length equal to or less than sixteen bits or two bursts each of length equal to or less then eight bits, the software-implemented correction algorithm is guaranteed to successfully correct the actual error(s) in the data.

Overview of the Nine Syndrome Correction Algorithm

The coefficients of S(x) are used to iteratively generate the coefficients of the error locator polynomial $\sigma(x)$.

If the degree of $\sigma(x)$ indicates more than four errors exist, we evaluate $$\sigma(x) \text{ at } x = \alpha^L \tag{6}$$

for each L.

$$0 \leq L < 2^m - 1, \tag{7}$$

until the result is zero, which signifies that $\alpha^L$ is a root of $\sigma(x)$ and L is an error location.

When the location L of an error has been determined, $\sigma(x)$ is divided by $(x + \alpha^L)$, producing a new error locator polynomial of degree one less than that of the old:

$$\sigma(x) = \frac{\sigma(x)}{x + \alpha^L} \tag{8}$$

The error value E may be calculated directly from S(x) and the new $\sigma(x)$ using $$E = \alpha^{L \cdot m0} \cdot \frac{\sum_{i=0}^{j} \sigma_i \cdot S_{j-i}}{\sigma(x)|_{\alpha^L}} \tag{9}$$

where j is the degree of the new $\sigma(x)$.

When the degree j of $\sigma(x)$ is four or less, the time required to locate the remaining errors is reduced by using the special error locating (or special factoring) routines defined below, each of which locates one of the remaining errors without using the Chien search. After the location of an error has been determined by one of the special error locating routines, its value is calculated, $\sigma(x)$ is divided by $(x+\alpha^L)$, and $S(x)$ is adjusted in the same way as when an error is located by evaluating $\sigma(x)$.

When $j=1$, the error locator polynomial is $$x+\sigma_1=0 \tag{10}$$

By inspection, the root of this equation is $\sigma_1=\alpha^L$. Thus, $$L=\text{LOG}[\sigma_1], \tag{11}$$

When $j=2$, the error locator polynomial is $$x^2+\sigma_1{}^*x+\sigma_2=0. \tag{12}$$

Substituting $x=y*\sigma_1$ yields $$y^2+y+c=0, \text{ where } c=\frac{\sigma_2}{\sigma_1{}^2} \tag{13}$$

A root Y of this equation may be fetched from a pre-computed quadratic table derived according to $$\text{QUAD}[i^2+i]=i+1 \text{ FOR } i=0, 2, \ldots 2^m-2 \tag{14}$$

using c as an index. There are $2m-1$ such solutions; the other elements of the table are set to zero, an invalid number, to flag the existence of more than two errors. When $y\neq 0$ has been determined, reverse substitution yields an expression for one of the error locations.

$$\begin{aligned} L &= \text{LOG}(\sigma_1{}^*y) \\ &= \text{LOG}[\sigma_1{}^*\text{QUAD}[C]] \end{aligned} \tag{15}$$

When $j=3$, the error locator polynomial is $$x^3+\sigma_1{}^*x^2+\sigma_2{}^*x+\sigma_3=0$$

Substituting $$x=w+\sigma_1, w=t+\frac{B}{t}, v=\frac{t^3}{B} \tag{16}$$

yields a quadratic equation in v:

$$v^2+v+\frac{A^3}{B^2}=0 \tag{17}$$

where $$A=\sigma_1{}^2+\sigma_2 \text{ and } B=\sigma_1{}^*\sigma_2+\sigma_3.$$

A root V of this equation may be found by the quadratic method above. Then by reverse substitution $$L=\text{LOG}\left[\sigma_1+(B^*V)^{\frac{1}{3}}+\frac{A}{(B^*V)^{\frac{1}{3}}}\right] \tag{18}$$

When $j=4$, the error locator polynomial is $$x^4+\sigma_1{}^*x^3+\sigma_2{}^*x^2+\sigma_3{}^*x+\sigma_4=0.$$

If $\sigma_1=0$, assign $b_i=\sigma_i$ for $i=2$ to 4, otherwise substitute $$z=\frac{1}{x+(\sigma_3/\sigma_1)^{\frac{1}{2}}} \tag{19}$$

to give $$z^4+b_2z^2+b_3z+b_4=0 \tag{20}$$

where $$b_4=\frac{\sigma_1{}^2}{\sigma_1{}^{2*}\sigma_4+\sigma_1{}^{*}\sigma_2{}^{*}\sigma_3+\sigma_3{}^2} \tag{21}$$

$$b_3=\sigma_1{}^*b_4$$

$$b_2=((\sigma_1{}^*\sigma_3)^{\frac{1}{2}}+\sigma_2)^*b_4.$$

The resulting affine polynomial may be solved in the following manner:

1) Solve for a root Q of the equation $q^3+b_2{}^*q+b_3=0$ by the cubic method above.
2) Solve for a root S of the equation $s^2+b_3/Q^*s+b_4=0$ by the quadratic method above.
3) Solve for a root Z of the equation $z^2+Q^*z+S=0$ by the quadratic method above.

If $\sigma_1=0$, $L=\text{LOG}[Z]$, otherwise reverse substitution yields $$L=\text{LOG}\left[(\sigma_3/\sigma_1)^{\frac{1}{2}}+\frac{1}{Z}\right] \tag{22}$$

While a specific embodiment of this invention has been disclosed, it is expected that those skilled in the art can and will design alternate embodiments of this invention that fall within the scope of the appended claims.

We claim:

1. A multibyte error code generation system, operable to identify errors in each sub-block of a block of data, said block having a plurality of sub-blocks, each of which has at least one codeword, each codeword consisting of a unique combination of data and check bytes, said system comprising:

first syndrome generating means for producing a first set of check bytes, corresponding to the modulo 2 sum of bit positions of (n+2)nd, (n+1)st and (n)th sub-blocks selected systematically in accordance with a predetermined parity check matrix;

second syndrome generating means for producing a second set of check bytes, corresponding to the modulo 2 sum of bit positions of said (n+1)st, (n)th and (n−1)st sub-blocks selected systematically in accordance with a predetermined parity check matrix;

third syndrome generating means for producing a third set of check bytes, corresponding to the modulo 2 sum of bit positions of said (n)th, (n−1)st and (n−2)nd sub-blocks selected systematically in accordance with a predetermined parity check matrix;

means for appending said generated check bytes to said sub-blocks.

2. The system of claim 1 wherein said appending means includes:

means for appending said third set of check bytes to said codewords of said (n)th sub-block, means for appending said second set of check bytes to said codewords of said (n+1)st sub-block, and means for appending said first set of check bytes to said codewords of said (n+2)nd sub-block.

3. The system of claim 2 further including:

means, responsive to the receipt of the last sub-block of said block of data for sequentially activating said first, second and third syndrome generating means to produce said first, second and third sets of check bytes, respectively;

means, responsive to said activating means, for appending said first, second and third sets of check bytes, generated in response to said activating means to said last sub-block of said block of data.

4. A multibyte error code generation system, operable to identify errors in each sub-block of a block of data, said block having a plurality of sub-blocks, each of which has at least one codeword, each codeword consisting of a unique combination of data and check bytes, said system comprising:

first syndrome generating means for producing a first set of check bytes, corresponding to the modulo 2 sum of bit positions of (n+2)nd, (n+1)st and (n)th sub-blocks selected systematically in accordance with a predetermined parity check matrix;

means for appending said first set of check bytes to said codewords of said (n+2)nd sub-block;

second syndrome generating means for producing a second set of check bytes, corresponding to the modulo 2 sum of bit positions of said (n+1)st, (n)th and (n−1)st sub-blocks selected systematically in accordance with a predetermined parity check matrix;

means for appending said second set of check bytes to said codewords of said (n+1)st sub-block;

third syndrome generating means for producing a third set of check bytes, corresponding to the modulo 2 sum of bit positions of said (n)th, (n-1)st and (n−2)nd sub-blocks selected systematically in accordance with a predetermined parity check matrix;

means for appending said third set of check bytes to said codewords of said (n)th sub-block.

5. The system of claim 4 further including:

means responsive to the receipt of the last sub-block of said block of data for sequentially activating said first, second and third syndrome generating means to produce said first, second and third sets of check bytes, respectively;

means responsive to said activating means, for appending said first, second and third sets of check bytes, generated in response to said activating means to said last sub-block of said block of data.

6. A multibyte error code generation system, operable to identify up to $t_1$ errors in each sub-block of a block of data and up to $t_2$ errors in said block, where $t_1$ and $t_2$ are positive integers and $t_2 > t_1$, said block having a plurality of sub-blocks, each of which has at least one codeword containing up to $2^b$-1 b-bit character positions, where b is a positive integer, each codeword consisting of a unique combination of data and $2t_1 + t_3$ check bytes, where $t_3$ is a positive integer greater than or equal to $t_1$, said system comprising:

first syndrome generating means for producing $2t_1 + t_3$ check bytes, each containing b bits, corresponding to the modulo 2 sum of bit positions of said codewords in the (n+2)nd, (n+1)st and (n)th sub-blocks selected systematically in accordance with a predetermined parity check matrix;

second syndrome generating means for producing $2t_1 + t_3$ check bytes, each containing b bits, corresponding to the modulo 2 sum of bit positions of said codewords in the (n+1)st, (n)th and (n−1)st sub-blocks selected systematically in accordance with a predetermined parity check matrix;

third syndrome generating means for producing $2t_1 + t_3$ check bytes, each containing b bits, corresponding to the modulo 2 sum of bit positions of said codewords in the (n)th, (n−1)st and (n−2)nd sub-blocks selected systematically in accordance with a predetermined parity check matrix;

means for appending said generated check bytes to said sub-block.

7. The system of claim 6 wherein said appending means includes:

means for appending said third set of check bytes to said codewords of said (n)th sub-block;

means for appending said second set of check bytes to said codewords of said (n+1)st sub-block, and means for appending said second set of check bytes to said codewords of said (n+2)nd sub-block.

8. The system of claim 7 further including:

means, responsive to the receipt of the last sub-block of said block of data for sequentially activating said first, second and third syndrome generating means to produce said first, second and third sets of check bytes, respectively;

means, responsive to said activating means, for appending said first, second and third sets of check bytes, generates in response to said activating means to said last sub-block of said block of data.

9. In a multibyte error code generation system, operable to identify errors in each sub-block of a block of data, said block having a plurality of sub-blocks, each of which has at least one codeword, each codeword consisting of a unique combination of data and check bytes, a method of identifying errors in said block of data comprising the steps of:

producing a first set of check bytes, corresponding to the modulo 2 sum of bit positions of (n+2)nd, w(n+1 w)st and (n)th sub-blocks selected systematically in accordance with a predetermined parity check matrix;

producing a second set of check bytes, corresponding to the modulo 2 sum of bit positions of said (n+1)st, (n)th and (n−1)st sub-blocks selected systematically in accordance with a predetermined parity check matrix;

producing a third set of check bytes, corresponding to the modulo 2 sum of bit positions of said (n)th, (n−1)st and (n−2)nd sub-blocks selected systematically in accordance with a predetermined parity check matrix;

appending said generated check bytes to said sub-blocks.

10. The method of claim 9 wherein said step of appending includes:

appending said third set of check bytes to said codewords of said (n)th sub-block, appending said second set of check bytes to said codewords of said (n+1)st sub-block, and appending said second set of check bytes to said codewords of said (n+2)nd sub-block.

11. The method of claim 10 further including the steps of: sequentially producing, in response to the receipt of the last sub-block of said block of data, said first, second and third sets of check bytes, respectively;

appending, in response to said step of activating, said first, second and third sets of check bytes, to said last sub-block of said block of data.

12. In a multibyte error code generation system, operable to identify errors in each sub-block of a block of data, said block having a plurality of sub-blocks, each of which has at least one codeword, each codeword consisting of a unique combination of data and check bytes, a method of identifying errors in said block of data comprising the steps of:

producing a first set of check bytes, corresponding to the modulo 2 sum of bit positions of (n+2)nd, (n+1)st and (n)th sub-blocks selected systematically in accordance with a predetermined parity check matrix;

appending said first set of check bytes to said codewords of said (n+2)nd sub-block;

producing a second set of check bytes, corresponding to the modulo 2 sum of bit positions of said (n+1)st, (n)th and (n−1)st sub-blocks selected systematically in accordance with a predetermined parity check matrix;

appending said second set of check bytes to said codewords of said (n+1)st sub-block;

producing a third set of check bytes, corresponding to the modulo 2 sum of bit positions of said (n)th, (n−1)st and (n−2)nd sub-blocks selected systematically in accordance with a predetermined parity check matrix;

appending said third set of check bytes to said codewords of said (n)th sub-block.

13. The method of claim 12 further including the steps of:

sequentially generating, in response to the receipt of the last sub-block of said block of data, said first, second and third sets of check bytes, respectively;

appending, in response to said step of activating, said first, second and third sets of check bytes to said last sub-block of said block of data.

14. In a multibyte error code generation system, operable to identify up to $t_1$ errors in each sub-block of a block of data and up to $t_2$ errors in said block, where $t_1$ and $t_2$ are positive integers and $t_2 > t_1$, said block having a plurality of sub-blocks, each of which has at least one codeword containing up to $2^b-1$ b-bit character positions, where b is a positive integer, each codeword consisting of a unique combination of data and $2t_1+t_3$ check bytes, where $t_3$ is a positive integer greater than or equal to $t_1$, a method of identifying errors in said block of data comprising the steps of:

producing $2t_1+t_3$ check bytes, each containing b bits, corresponding to the modulo 2 sum of bit positions of said codewords in the (n+2)nd, (n+1)st and (n)th sub-blocks selected systematically in accordance with a predetermined parity check matrix;

producing $2t_1+t_3$ check bytes, each containing b bits, corresponding to the modulo 2 sum of bit positions of said codewords in the (n+1)st, (n)th and (n−1)st sub-blocks selected systematically in accordance with a predetermined parity check matrix;

producing $2t_1+t_3$ check bytes, each containing b bits, corresponding to the modulo 2 sum of bit positions of said codewords in the (n)th, (n−1)st and (n−2)nd sub-blocks selected systematically in accordance with a predetermined parity check matrix;

appending said generated check bytes to said sub-block.

15. The method of claim 14 wherein said step of appending includes:

appending said third set of check bytes to said codewords of said (n)th sub-block, appending said second set of check bytes to said codewords of said (n+1)st sub-block, and appending said second set of check bytes to said codewords of said (n+2)nd sub-block.

16. The method of claim 15 further including the steps of:

sequentially producing, in response to the receipt of the last sub-block of said block of data, said first, second and third sets of check bytes, respectively;

appending, in response to said step of activating, said first, second and third sets of check bytes, to said last sub-block of said block of data.

* * * * *